(12) United States Patent
Dela Torre et al.

(10) Patent No.: US 12,451,383 B2
(45) Date of Patent: Oct. 21, 2025

(54) CORNER RELIEF UNDERCUT TO REDUCE DIE DAMAGE

(71) Applicant: Littelfuse, Inc., Chicago, IL (US)

(72) Inventors: Hermie Dela Torre, Chicago, IL (US); Librado Galang, Chicago, IL (US); Jason Costoya, Chicago, IL (US); Nathaniel Garcia, Chicago, IL (US)

(73) Assignee: Littelfuse, Inc., Rosemont, IL (US)

( * ) Notice: Subject to any disclaimer, the term of this patent is extended or adjusted under 35 U.S.C. 154(b) by 0 days.

(21) Appl. No.: 18/424,994

(22) Filed: Jan. 29, 2024

(65) Prior Publication Data

US 2025/0246465 A1    Jul. 31, 2025

(51) Int. Cl.
*H01L 21/673* (2006.01)

(52) U.S. Cl.
CPC .............................. *H01L 21/67333* (2013.01)

(58) Field of Classification Search
CPC ......... H01L 21/67333; H01L 21/67356; H01L 21/6734; H01L 21/67346; H01L 21/67353; H01L 21/67359
USPC .................. 206/707, 710, 724, 712, 701, 711
See application file for complete search history.

(56) References Cited

U.S. PATENT DOCUMENTS

| | | | |
|---|---|---|---|
| 6,021,904 A * | 2/2000 | Kozol | H01L 21/67333 53/473 |
| 6,857,524 B2 | 2/2005 | Duban-hu et al. | |
| 2015/0228517 A1 * | 8/2015 | Toc | H01L 21/67333 29/559 |
| 2020/0156884 A1 * | 5/2020 | Kuo | B65G 15/28 |
| 2022/0250784 A1 | 8/2022 | Zhao et al. | |
| 2023/0070970 A1 | 3/2023 | Lee | |
| 2023/0141485 A1 * | 5/2023 | Kim | H01L 24/95 257/88 |

FOREIGN PATENT DOCUMENTS

| | | |
|---|---|---|
| JP | 2020155457 A | 9/2020 |
| KR | 100374150 B1 | 3/2003 |
| TW | I666737 B | 7/2019 |

OTHER PUBLICATIONS

European Search Report for EP Application No. 25153198.4, dated Jun. 5, 2025, 10 pages.

\* cited by examiner

*Primary Examiner* — Rafael A Ortiz
(74) *Attorney, Agent, or Firm* — KDW Firm PLLC

(57) ABSTRACT

Disclosed are dies carriers for receiving a plurality of circuit protection devices. In some embodiments, a die carrier may include a die body, and a recess in the die body, wherein the recess is operable to receive a die for a circuit protection device. The recess may include a central area defined by a set of sidewalls, and a plurality of corner areas extending from the central area, each of the corner areas defined by a first curved wall, a second curved wall connected to the first curved wall, and a third curved wall connected with the second curved wall, wherein a first center of curvature of the first curved wall is in a different location than a second center of curvature of the second curved wall.

14 Claims, 3 Drawing Sheets

CORNER RELIEF UNDERCUT TO REDUCE DIE DAMAGE

FIELD OF THE DISCLOSURE

The present disclosure is generally related to the field of circuit protection device manufacturing. More particularly, embodiments of the present disclosure relate to a corner relief undercut design to reduce die damage.

BACKGROUND OF THE DISCLOSURE

Existing designs of boat die aligners for a die window opening commonly use one or two-sided undercuts for each of the four corners with the goal of preventing die chip-out while still providing restricted movement of the die placement, which is manually inserted by an operator. However, die failures are still common with existing undercut designs.

There is a need, therefore, for an improved relief undercut to eliminate die corner chip-out related to die aligner in discrete manual line assemblies.

SUMMARY OF THE DISCLOSURE

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

In one approach, a die carrier may include a recess operable to receive a die, the recess including a central area defined by a set of sidewalls, and a plurality of corner areas extending from the central area. Each of the corner areas may be defined by a first curved wall, a second curved wall connected to the first curved wall, and a third curved wall connected with the second curved wall, wherein a first center of curvature of the first curved wall is in a different position than a second center of curvature of the second curved wall.

In another approach, a die carrier may include a die body, and a recess in the die body, wherein the recess is operable to receive a circuit protection device of the plurality of circuit protection devices. The recess may include a central area defined by a set of sidewalls, and a plurality of corner areas extending from the central area, each of the corner areas defined by a first curved wall, a second curved wall connected to the first curved wall, and a third curved wall connected with the second curved wall, wherein a first center of curvature of the first curved wall is in a different position than a second center of curvature of the second curved wall.

In yet another approach, a die carrier for receiving a plurality of dies for circuit protection devices may include a die body, and a recess in the die body, wherein the recess is operable to receive a circuit protection device of the plurality of circuit protection devices. The recess may include a central area defined by a set of sidewalls, and a plurality of corner areas extending from the central area. Each of the corner areas may be defined by a first curved wall, a second curved wall connected to the first curved wall, and a third curved wall connected with the second curved wall, wherein a first center of curvature of the first curved wall is in a different position than a position of the second center of curvature of the second curved wall, and in a different position than a position of the third center of curvature of the third curved wall.

BRIEF DESCRIPTION OF THE DRAWINGS

The accompanying drawings illustrate exemplary approaches of the disclosed embodiments so far devised for the practical application of the principles thereof, and wherein.

Figure 1:
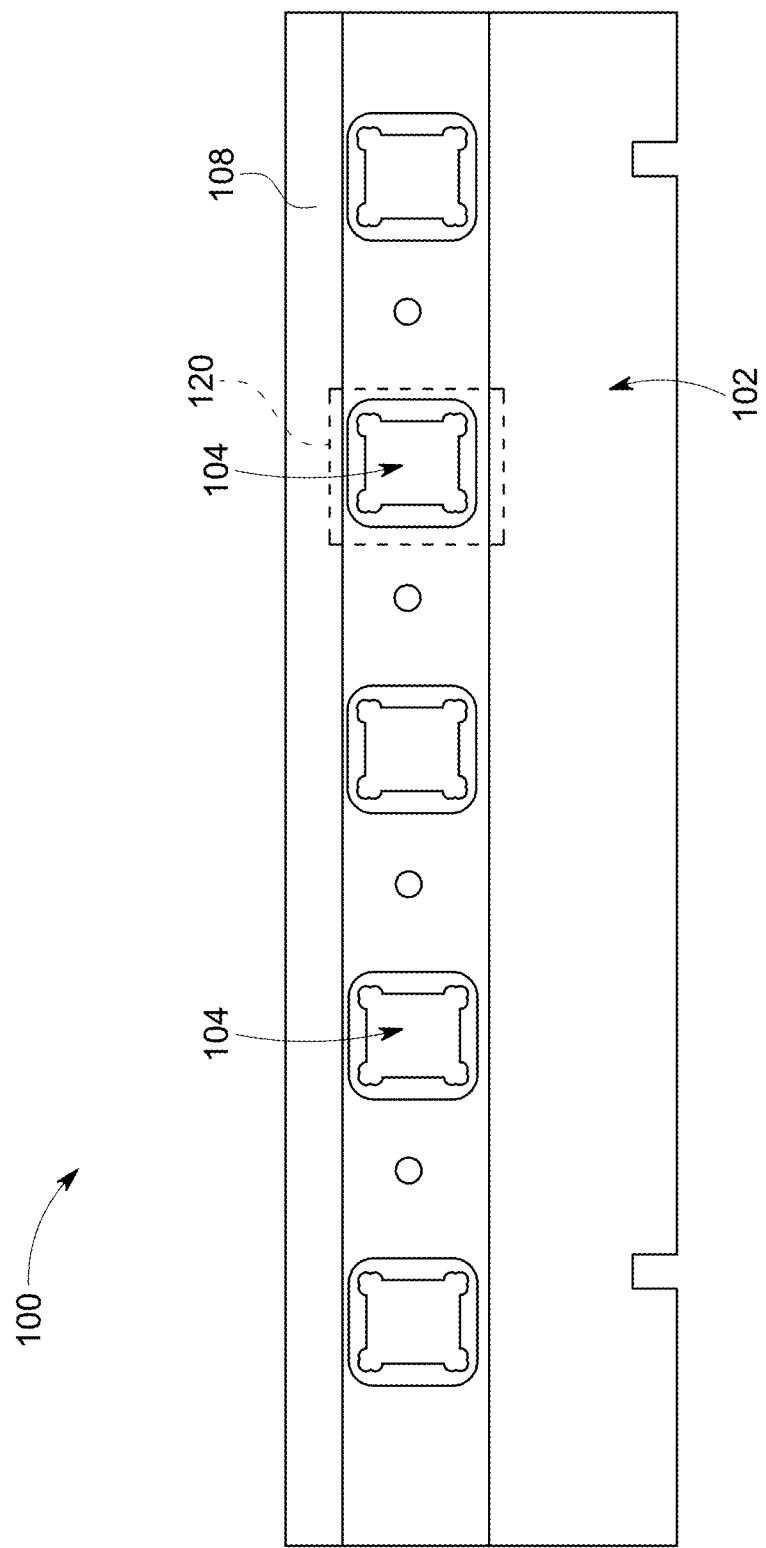
FIG. 1 depicts a top view of a die carrier according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Assemblies, devices, systems, and methods in accordance with the present disclosure will now be described more fully hereinafter with reference to the accompanying drawings, where embodiments are shown. The assemblies, devices, systems, and methods may be embodied in many different forms and are not to be construed as being limited to the embodiments set forth herein. Instead, these embodiments are provided so the disclosure will be thorough and complete, and will fully convey the scope of the disclosure to those skilled in the art.

Turning to FIG. 1, a die carrier 100 will be described. As shown, the die carrier 100 may include a body 102 having a plurality of recesses or openings 104 formed therein. Each of the openings 104 may represent an area 120 in which a die may be positioned, such as a die used during manufacturing of a circuit protection device. As shown, each of the openings 104 may be recessed below an upper surface 108 of the body 102. Although only five openings 104 are shown, it will be appreciated that a greater or lesser number of openings 104 may be present in other embodiments.

Figure 2:
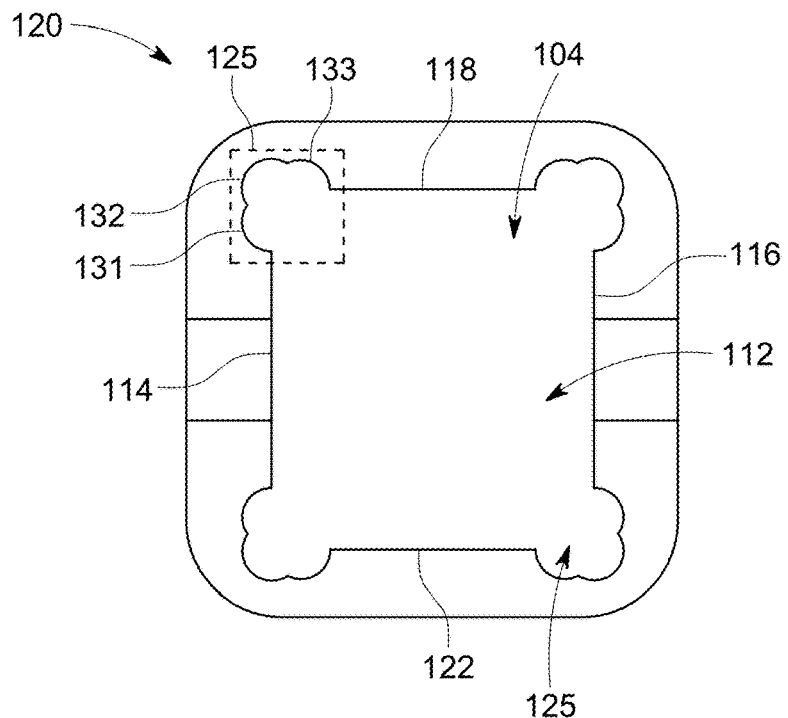
FIG. 2 depicts a close-up view of a portion of an opening of the die carrier according to embodiments of the present disclosure.

FIG. 2 demonstrates an example area 120 in greater detail. As shown, the opening 104 may include a central area 112 defined by a set of sidewalls. More specifically, the set of sidewalls may include a first sidewall 114 opposite a second sidewall 116, and a top sidewall 118 opposite a bottom sidewall 122. In the embodiment shown, the first sidewall 114 and the second sidewall 116 are parallel to one another, and the top sidewall 118 and the bottom sidewall 122 are also parallel to one another. As such, the central area 112 generally has a square shape.

As further shown, the opening 104 includes a plurality of corner areas 125 extending from the central area 112. More specifically, each corner area 125 is connected with two adjacent sidewalls of the set of sidewalls. As will be described in greater detail herein, each of the corner areas 125 defines a first curved wall 131, a second curved wall 132 connected to the first curved wall 131, and a third curved wall 133 connected with the second curved wall 132. In the embodiment shown, the depth of the plurality of corner areas 125 is the same or substantially the same as the depth of the central area 112. In other embodiments, the depth of the plurality of corner areas 125 may be different than the depth of the central area 112.

Figure 3:
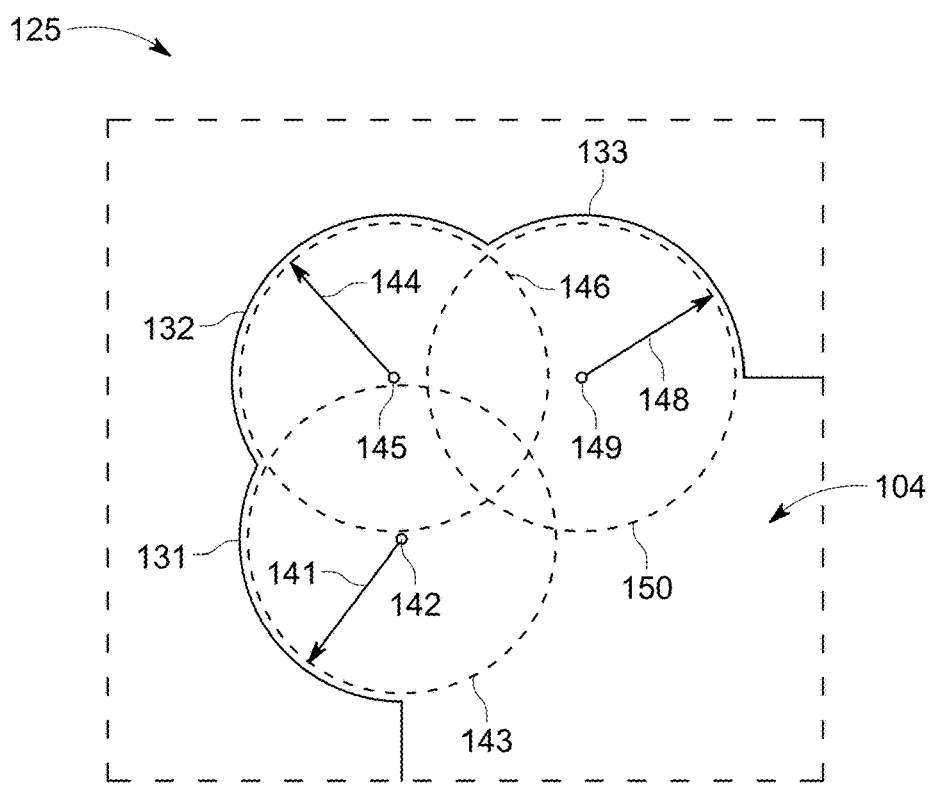
FIG. 3 depicts a close-up view of a corner area of the opening according to embodiments of the present disclosure.

FIG. 3 demonstrates one of the corner areas 125 in greater detail. As shown, the first curved wall 131 defines a first radius of curvature 141, a first center of curvature 142, and a first imaginary circle 143. Similarly the second curved wall 132 defines a second radius of curvature 144, a second center of curvature 145, and the second imaginary circle 146. The third curved wall 133 defines a third radius of curvature 148, a third center of curvature 149, and the third imaginary circle 150. As demonstrated, the first, second, and third imaginary circles 143, 146, 150 overlap or intersect with one another. The first center of curvature 142, the second center of curvature 145, and the third center of curvature 149 are arranged at different positions, wherein the second center of curvature 145 is positioned farthest away from a center of the central area 112.

In the embodiment shown, each of the first curved wall 131, the second curved wall 132, and the third curved wall 133 may have a same, or substantially the same, length and have a constant radius of curvature. As such, an area of the first, second, and third imaginary circles 143, 146, 150 may be the same, or substantially the same. In other embodiments, the area of the first, second, and third imaginary circles 143, 146, 150 may be different.

Figure 4A:
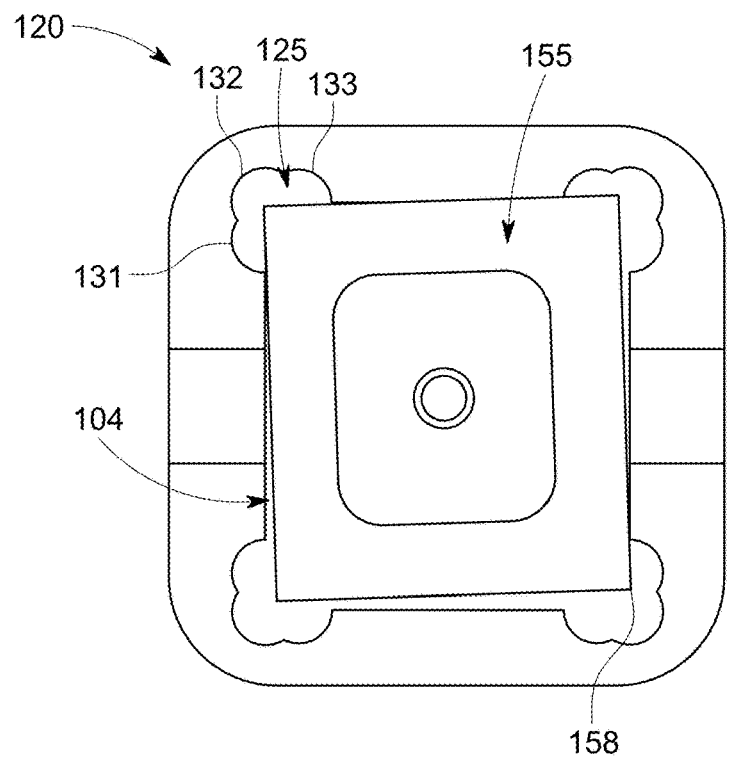
FIGS. 4A-4B depicts top views of the die carrier and dies according to embodiments of the present disclosure.
Figure 4B:
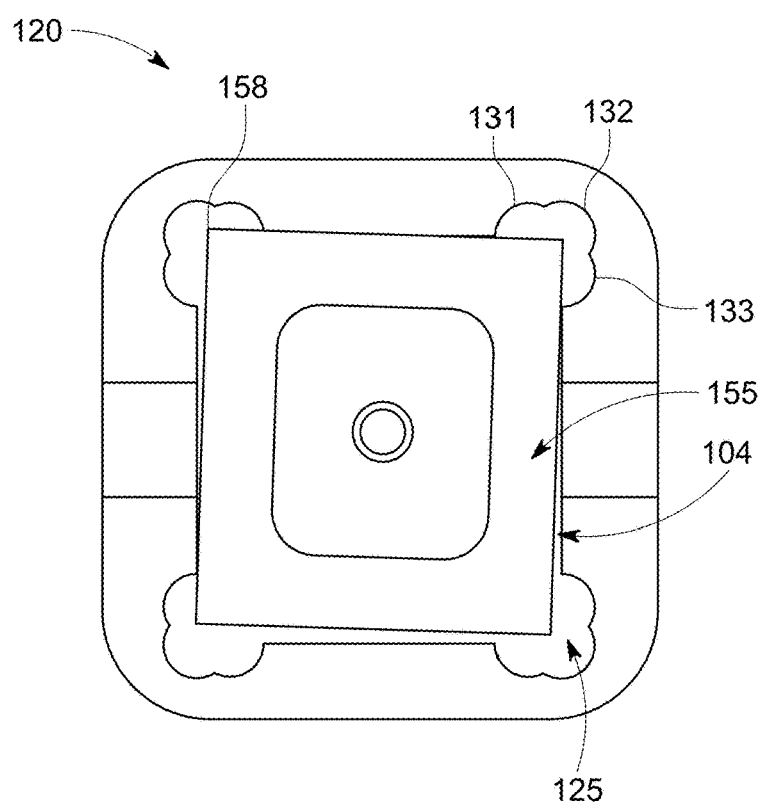

FIGS. 4A-4B demonstrate the benefit of the corner areas 125 during use with a die 155. As shown, the die 155 may be positioned askew within the opening 104. However, because of the size and geometry of each of the corner areas 125, a corner 158 of the die 155 may not impact any of the first sidewall 131, the second sidewall 132, or the third sidewall 133, thereby decreasing (or eliminating) potential for damage to the corners 158.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A die carrier, comprising:
    a recess operable to receive a die, the recess comprising:
        a central area defined by a set of sidewalls; and
        a plurality of corner areas extending from the central area, each of the plurality of corner areas defined by a first curved wall, a second curved wall connected to the first curved wall, and a third curved wall connected with the second curved wall, wherein a first center of curvature of the first curved wall is in a different location than a second center of curvature of the second curved wall, wherein the first curved wall defines a first radius of curvature and a first imaginary circle, wherein the second curved wall defines a second radius of curvature and a second imaginary circle, and wherein the third curved wall defines a third radius of curvature and a third imaginary circle, wherein the first radius of curvature, the second radius of curvature, and the third radius of curvature each have a same length, and wherein the first, second, and third imaginary circles overlap with one another.

2. The die carrier of claim 1, wherein a third center of curvature of the third curved wall is in a different location than the first center of curvature and the second center of curvature.

3. The die carrier of claim 1, wherein the set of sidewalls comprises:
    a first sidewall opposite a second sidewall; and
    a top sidewall opposite a bottom sidewall, wherein the top and bottom sidewalls are connected to the first sidewall and the second wall by the plurality of corner areas.

4. The die carrier of claim 1, further comprising a second recess operable to receive a second die.

5. The die carrier of claim 1, wherein the second curved wall is positioned farther away from the central area than the first curved wall and the third curved wall.

6. The die carrier of claim 1, wherein the recess extends below an upper surface of a die body.

7. A die carrier for receiving a plurality of dies for circuit protection devices, the die carrier comprising:
  a die body; and
  a recess in the die body, wherein the recess is operable to receive a circuit protection device of the plurality of circuit protection devices, and wherein the recess comprises:
    a central area defined by a set of sidewalls; and
    a plurality of corner areas extending from the central area, each of the plurality of corner areas defined by a first curved wall, a second curved wall connected to the first curved wall, and a third curved wall connected with the second curved wall, wherein a first center of curvature of the first curved wall is in a different position than a second center of curvature of the second curved wall, wherein the first curved wall defines a first radius of curvature and a first imaginary circle, wherein the second curved wall defines a second radius of curvature and a second imaginary circle, and wherein the third curved wall defines a third radius of curvature and a third imaginary circle, wherein the first radius of curvature, the second radius of curvature, and the third radius of curvature each have a same length, and wherein the first, second, and third imaginary circles overlap with one another.

8. The die carrier of claim 7, wherein a third center of curvature of the third curved wall is in a different position than the first center of curvature and the second center of curvature.

9. The die carrier of claim 7, wherein the set of sidewalls comprises:
  a first sidewall opposite a second sidewall; and
  a top sidewall opposite a bottom sidewall, wherein the top and bottom sidewalls are connected to the first sidewall and the second wall by the plurality of corner areas.

10. The die carrier of claim 7, wherein the second curved wall is positioned farther away from the central area than the first curved wall and the third curved wall.

11. A die carrier for receiving a plurality of dies, the die carrier comprising:
  a die body; and
  a recess in the die body, wherein the recess is operable to receive a circuit protection device of the plurality of circuit protection devices, and wherein the recess comprises:
    a central area defined by a set of sidewalls; and
    a plurality of corner areas extending from the central area, each of the corner areas defined by a first curved wall, a second curved wall connected to the first curved wall, and a third curved wall connected with the second curved wall, wherein a first center of curvature of the first curved wall is in a different position than a position of the second center of curvature of the second curved wall, and in a different position than a position of the third center of curvature of the third curved wall, wherein the first curved wall defines a first radius of curvature and a first imaginary circle, wherein the second curved wall defines a second radius of curvature and a second imaginary circle, and wherein the third curved wall defines a third radius of curvature and a third imaginary circle, wherein the first radius of curvature, the second radius of curvature, and the third radius of curvature each have a same length, and wherein the first, second, and third imaginary circles overlap with one another.

12. The die carrier of claim 11, wherein the set of sidewalls comprises:
  a first sidewall opposite a second sidewall; and
  a top sidewall opposite a bottom sidewall, wherein the top and bottom sidewalls are connected to the first sidewall and the second wall by the plurality of corner areas.

13. The die carrier of claim 11, wherein the first radius of curvature, the second radius of curvature, and the third radius of curvature are each constant.

14. The die carrier of claim 11, wherein the second curved wall is positioned farther away from central area than the first curved wall and the third curved wall.

* * * * *